United States Patent [19]

Miyajima

[11] 4,389,662

[45] Jun. 21, 1983

[54] LIGHT-ACTIVATED SEMICONDUCTOR DEVICE

[75] Inventor: Tatsuo Miyajima, Itami, Japan

[73] Assignee: Mitsubishi Denki Kabushiki Kaisha, Tokyo, Japan

[21] Appl. No.: 176,104

[22] Filed: Aug. 7, 1980

[30] Foreign Application Priority Data

Aug. 28, 1979 [JP] Japan .................................. 54-110080

[51] Int. Cl.³ ...................... H01L 27/14; H01L 23/42
[52] U.S. Cl. ........................................ 357/30; 357/79
[58] Field of Search ..................................... 357/30, 79

[56] References Cited

U.S. PATENT DOCUMENTS

4,131,905 12/1978 Hanes et al. ..................... 357/300 R
4,257,058 3/1981 Ferro et al. ..................... 357/300 R
4,302,070 11/1981 Nakayama et al. ............... 357/30 X

FOREIGN PATENT DOCUMENTS

54-110080 8/1978 Japan .

*Primary Examiner*—Martin H. Edlow
*Assistant Examiner*—J. Carroll
*Attorney, Agent, or Firm*—Oblon, Fisher, Spivak, McClelland & Maier

[57] ABSTRACT

A light activated semiconductor device comprising a semiconductor element activated by an optical signal; at least two main electrodes, mutually insulated, for passing current from the activated semiconductor element; a casing comprising these main electrodes and hermetically sealing the semiconductor element; and a light cable passing through the casing so as to transmit the optical signal to the semiconductor element, characterized in that a hermetically formed light transmitting passage is optically connected to the light cable, said passage being hermetically held by a flexible flange fixed to a part of the casing and the conductor element is connected in press-contact with the main electrodes.

5 Claims, 2 Drawing Figures

LIGHT-ACTIVATED SEMICONDUCTOR DEVICE

BACKGROUND OF THE INVENTION

1. Field of the Invention

The present invention relates to a device activated by an optical signal. More particularly, it relates to an improvement of the assembled structure with the device.

2. Description of the Prior Art

FIG. 1 shows the conventional light-activated semiconductor device.

In FIG. 1, the reference numeral (1) designates the semiconductor substrate of a light-triggered thyristor having a light receiving part at the central portion; (2) designates a supporting plate made of molybdenum which is bonded on the semiconductor substrate (1) with a hard solder and is used as one electrode; (3) designates the other electrode brought into ohmic contact with the semiconductor substrate (1); (4) designates the other supporting plate made of molybdenum which is brazed to the electrode (3); (7) designates a copper base as one main electrode through which heat is transferred to a heat sink; (5) designates a brazing material for hermetically bonding the supporting plate (4) to the copper base (7); (9) designates an outer electrode as the other main electrode; (8) designates an insulating plate made of ceramic or glass etc. which insulates the outer electrode (9) from the copper base (7); (13) designates a metallic tube hermetically bonded to the insulating plate (8) and the copper base (7); thus an outer casing is formed by the copper base (7), the insulating plate (8) and the outer electrode (9); (6) designates a flexible inner lead wire brazed to the supporting plate at one end and crimped to the outer electrode at the other end; (10) designates a light cable inserted into the central through-hole of the copper base (7) and extending to the light receiving part of the semiconductor substrate (1); (11) designates a core consisting of a group of glass fibers at the center of the light cable (10); (14) designates a cover of the light cable (10) and (12) designates silicone rubber for protecting the exposed part of the PN junction of the semiconductor substrate (1).

In the conventional light-activated semiconductor device, the core (11) is formed by a single glass fiber having a diameter of 100 μm or less, or by a plurality of glass fibers shown in FIG. 1 and the cover (14) of the light cable (10) should be slidable relative to the core (11) in order to provide flexibility of the light cable (10). In this structure, it is impossible to attain a hermetic seal. Accordingly, the brazing material (5) is applied so as to completely seal around the casing so that the deterioration of voltage blocking characteristics caused by the exposing of the PN junction surface of the semiconductor substrate (1) can be prevented.

The disadvantages of the conventional light-activated semiconductor device are as follows; a main surface of a semi-conductor element comprising the semiconductor substrate (1), the supporting plate (2), the electrode (3) and the supporting plate (4) must be brazed on a part of the casing (e.g. the copper base (7) in FIG. 1) and accordingly, the occurrence of thermal fatigue of the brazing material (5) can not be prevented even though the supporting plate (4) made of molybdenum is provided; and the curvature of the light cable (10) can not be small when the light cable is employed in a device having a flat-shaped surface-cooling type casing (the small curvature results in a great increase of the light cable loss) and accordingly, it is difficult to employ the light cable in such a device.

SUMMARY OF THE INVENTION

It is an object of the present invention to overcome the disadvantages of the conventional device and to provide a light-activated semiconductor device for providing a high hermetic property for a light-introduction part and for preventing thermal fatigue of a semiconductor substrate.

The foregoing and other objects of the present invention have been attained by providing a light-activated semiconductor device comprising a semiconductor element activated by an optical signal, at least two main electrodes, mutually insulated, for passing current from the activated semiconductor element, a casing comprising these electrodes and hermetically sealing the semiconductor element; and a light cable passing through the casing so as to transmit the optical signal to the semiconductor element, wherein a hermetically formed light transmitting passage is optically connected to the light cable and is hermetically held by a flexible flange fixed to a part of the casing and the semiconductor element is connected in press-contact with the main electrodes.

DETAILED DESCRIPTION OF THE PREFERRED EMBODIMENTS

Figure 1:
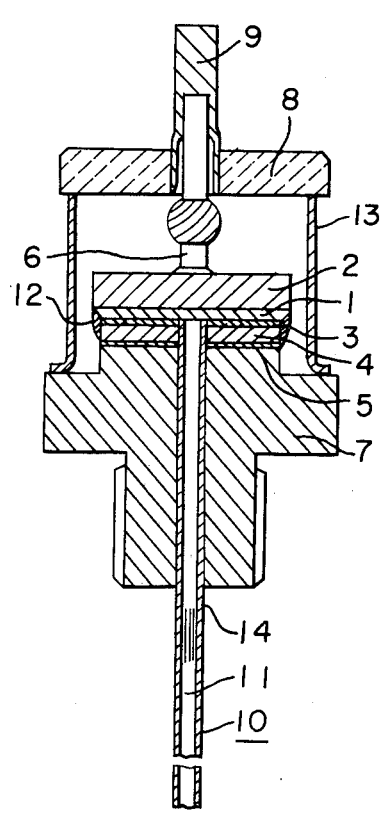
FIG. 1 is a vertically cross-sectional view of the conventional light-activated semiconductor device employing a light-triggered thyristor.
Figure 2:
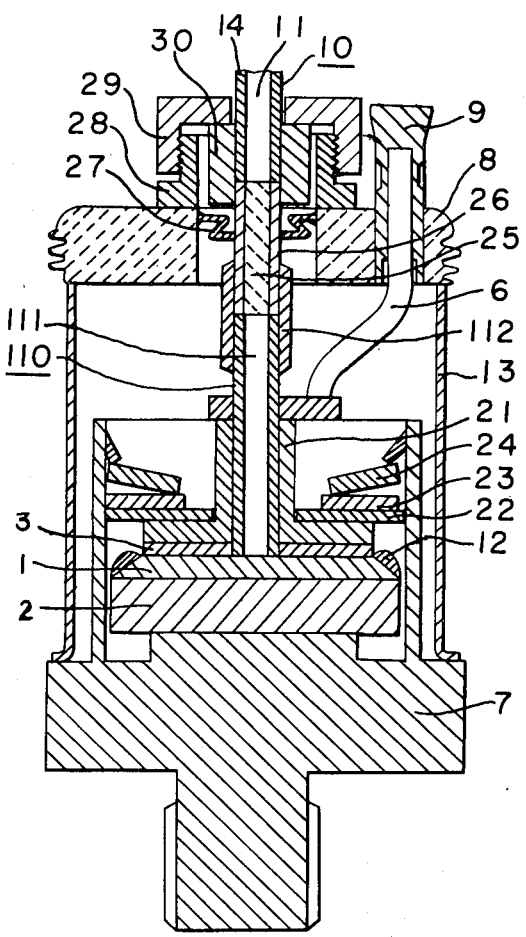
FIG. 2 is a vertically cross-sectional view of an embodiment of the present invention.

FIG. 2 shows an embodiment of the light-activated semiconductor device of the present invention wherein the elements designated by the reference numerals (1) to (3) and (6) to (14) correspond to those shown in FIG. 1.

The reference numeral (21) designates an inner electrode, as a main electrode formed in association with the outer electrode (9), in press-contact with the electrode (3) of the semiconductor substrate (1); (22) designates a mica plate for insulating the electrode (3) from the copper base (7) as the other main electrode; (23) designates a flat washer; (24) designates a disc spring providing pressure for the press-contacting; (25) designates a quartz-glass rod; (26) designates a Kovar tube (Fe.-Ni.Co alloy) which is melt-bonded to the quartz-glass rod (25) so as to provide a hermetic light transmitting passage. The material for a rod is not limited to quartz-glass, but can be of any optically transparent glass such as lead glass. The reference numeral (10) designates an inner light cable passing through the central hollow portion of the inner electrode (21) to the light receiving part of the semiconductor substrate (1); i.e. a light-triggered thyristor; (11) designates a core of the inner light cable; (112) designates a guide fixed to the inner light cable (110) so as to receive the tube (26); (27) designates a flexible Kovar flange melt-bonded to the tube (26) and the insulating plate (8) of the casing; (28) designates a connector melt-bonded to the insulating plate (8); (29) designates a box nut screwed to the connector (28) so as to position the light cable (10) at the center of the connector (28); and (30) designates a guide fitted to the light cable (10) and the tube (26). The outer light cable (10)

and the inner light cable (111) are optically connected to the light transmitting passage. The supporting plate (2) is in press-contact with the copper base (7) without the brazing. In this embodiment, a hermetic casing is formed by the copper base (7), the insulating plate (8), the outer electrode (9), the metallic tube (13) and the flange (27). A semiconductor element is formed by the semiconductor substrate (1), the supporting plate (2), the electrode (3) and silicone rubber protector (12).

In the embodiment having the structure described above, no problem of thermal fatigue of the brazing material occurs since the semiconductor element (1) is in press-contact with the copper base (7) and the inner electrode (21). Thermal fatigue due to the difference of the thermal expansion coefficient of the insulating plate (8) from that of the quartz-glass rod (25) or the tube (26) does not occur since the light transmitting passage comprising the quartz-glass rod (25) and the tube (26) is connected through the flange (27) to the insulating plate (8) of the casing. An excellent hermetic property of the light cable (10) is attained since the light transmitting passage passing through the casing is formed by the single quartz-glass rod (25). Mechanical strength of the flange (27) is not important factor and the securing of the light cable (10) is assured since the light cable (10) extending outside is held by the connector (28) fixed to the insulating plate (8) and the box nut (29).

The present invention is applicable to not only the light-triggered thyristor but also any light-activated semiconductor device such as a transister and triac.

As described above, the light-activated semiconductor device of the present invention provides the advantages of no generation of stress due to thermal expansion since the hermetically formed light transmission passage passing through the casing is hermetically held by the flexible flange; and no problem of thermal fatigue since both electrodes of the semiconductor element are connected in press-contact with the electrode passing the current without brazing.

I claim:

1. In a light activated semiconductor device comprising a semiconductor element activated by an optical signal; at least two main electrodes, mutually insulated for passing current from the activated semiconductor element; a casing comprising said main electrodes and hermetically sealing the semiconductor element; and a light cable passing through the casing by means of a light transmitting passage so as to transmit the optical signal to the semiconductor element, an improvement comprising:

a hermetically formed light transmitting glass optically connected to said light cable, said glass being hermetically held by and contacting a flexible flange fixed to a part of the casing containing said light transmitting glass; and pressure means inside said casing for press-contacting said semiconductor element with said main electrodes.

2. A light-activated semiconductor device according to claim 1 wherein the light transmitting passage passing through the casing is formed by a single piece of an optically transparent material.

3. A light-activated semiconductor device according to claim 2 wherein the single piece of the optically transparent material is made of glass and a metallic tube having a thermal expansion coefficient closer to that of the glass is hermetically bonded around the piece.

4. A light-activated semiconductor device according to claim 3 wherein the glass is quartz glass.

5. A light-activated semiconductor device according to claim 1 wherein a connector is fitted on the outer wall of the casing in coaxial with the light transmitting passage passing through the casing and a box nut is screwed on the connector so that an outer light cable is held by both.

* * * * *